United States Patent [19]
Aono

[11] Patent Number: 5,850,088
[45] Date of Patent: Dec. 15, 1998

[54] TEG FOR CARRIER LIFETIME EVALUATION

[75] Inventor: Shinji Aono, Tokyo, Japan

[73] Assignee: Mitsubishi Denki Kabushiki Kaisha, Tokyo, Japan

[21] Appl. No.: 861,802

[22] Filed: May 22, 1997

[30] Foreign Application Priority Data

Dec. 17, 1996 [JP] Japan ................................. 8-336558

[51] Int. Cl.$^6$ ........................... H01L 23/48; H01L 29/78; G01R 31/26
[52] U.S. Cl. ........................... 257/48; 257/378; 324/763; 324/767; 324/769
[58] Field of Search ...................... 257/48, 378; 324/763, 324/765–769

[56] References Cited

U.S. PATENT DOCUMENTS

| | | | |
|---|---|---|---|
| 3,462,685 | 8/1969 | Hornak | 324/767 |
| 3,697,873 | 10/1972 | Mazur | 257/48 |
| 4,364,073 | 12/1982 | Becke et al. | 257/330 |
| 4,542,340 | 9/1985 | Chakrauarti et al. | 257/48 |
| 4,564,807 | 1/1986 | Ikezi et al. | 324/767 |
| 5,285,082 | 2/1994 | Axer | 257/48 |
| 5,532,502 | 7/1996 | Seki | 257/378 |
| 5,608,335 | 3/1997 | Tailliet | 324/763 |
| 5,701,018 | 12/1997 | Hanaoka et al. | 257/378 |

FOREIGN PATENT DOCUMENTS

| | | |
|---|---|---|
| 56-50561 | 5/1981 | Japan . |
| 57-60849 | 4/1982 | Japan . |
| 57-157535 | 9/1982 | Japan . |
| 62-55964 | 3/1987 | Japan . |

OTHER PUBLICATIONS

Ichiro Omura, et al., "An Accurate PC Aided Carrier Lifetime Determination Technique From Diode Reverse Recovery Waveform" Proceedings of 1995 International Symposium on Power Semiconductor Devices & ICs. Yokohama. pp. 422–426.

J. Linnros, et al., "Depth Resolved Carrier Lifetime Measurements of Proton Irradiated Thyristors" IEDM 91, pp. 157–160.

*Primary Examiner*—Gene M. Munson
*Attorney, Agent, or Firm*—Oblon, Spivak, McClelland, Maier & Neustadt, P.C.

[57] ABSTRACT

This invention provides TEGs for improving accuracy of lifetime evaluation. The TEGs include a base region <Ba> selectively having a cathode region <C> in the surface portion thereof, and an anode region <A>. The intersection of a center line of the cathode region <C> and the anode region <A> provides a function region <WT> located within the range of 5h, five times as much as a height h of a wafer <W>. The function region <WT> makes a pair with the cathode region <C> and actually serves as an actual anode region for the cathode region <C>. As an area ratio of the cathode region <C> to the function region <WT> is smaller, ON voltage values Vf obtained for respective lifetime values get isolated from each other. Thus, the cathode region <C> is formed so that the area ratio of the cathode region <C> to the function region <WT> is about 1/1750000 to 1/4500.

9 Claims, 18 Drawing Sheets

TEG FOR CARRIER LIFETIME EVALUATION

BACKGROUND OF THE INVENTION

1. Field of the Invention

This invention is directed to TEGs for carrier lifetime evaluation in a semiconductor substrate.

2. Description of the Background Art

Lifetime value of carriers such as electrons or holes is an important element with a direct relevance to various characteristics of power devices. In a conventional technique, a wafer for lifetime evaluation has been produced, besides a wafer for product use, to perform an evaluation.

FIG. 29 is a plan view showing a wafer W with TEGs (test element groups) according to the conventional technique. As shown in this figure, a plurality of TEGs are formed in the wafer W. FIG. 30 is a sectional view of the TEG shown in FIG. 29. The TEGs correspond to diodes consisting of a cathode region C of $N^+$, a base layer Ba of $N^-$ and an anode region A of $P^+$ progressively formed one above the other.

In the conventional method, the carrier lifetime value is evaluated by observing a change in value of current, flowing in a diode shown in FIG. 30, in time sequence. FIG. 31 is a circuit diagram showing a schematic structure of a circuit used for the conventional evaluation method. A TEG shown as a diode and a load resistance are connected in series with a pulse power source PS which provides a pulse wave. Measurement of difference in voltage between both edges of the load resistance with an oscilloscope Os provides the amount of current flowing in the diode, thereby observing a change in characteristic of the diode in time sequence, relating to the carrier lifetime value.

FIG. 32 is a circuit diagram specifically showing the detailed structure of the circuit shown in FIG. 31. Outputs from a function generator FG, and plus and minus power sources G1, G2 are inputted in a pulse generation circuit PGC via coaxial cables. The pulse generation circuit PGC inputs an infinitely small signal inputted via the coaxial cables to amplify it to a sufficient amplitude required as a power source, and outputs it from output terminals. A chip (not shown) fixed to a holder H and a resistor R are connected in series with plus and minus terminals of the pulse generation circuit PGC. A probe pin PN is fixed to both edges of the resistor R to detect voltage, which is inputted in an oscilloscope Os to be analyzed by a computer CM.

FIG. 33 shows a waveform diagram of a current flowing in the TEG as a diode displayed in the oscilloscope Os. The vertical and horizontal axes indicate the amount of current, and time, respectively. When a predetermined value of a pulse voltage changes from forward to reverse at a time Ta in the circuit shown in FIG. 31, the current value drops to the smallest negative value at a time Tb and then gradually goes up toward zero. If 10% of the current value is obtained at a time Tc where the smallest negative value is 100%, the time required for 90% reduction (Tc-Tb) is defined as a reverse recovery time Trr.

The reverse recovery time Trr is influenced by the carrier lifetime value.

Thus, the lifetime value in the TEGs is inferable by obtaining the reverse recovery time Trr. Inference of the lifetime value, however, requires not only measurement of the reverse recovery time Trr but also simulation thereof. A comparison between simulation results and measured values leads to inference of the lifetime values in the TEGs.

Simulation of density in current flowing in electrodes of the TEGs is carried out with lifetime values $\tau n$, $\tau p$ of electrons and holes, respectively, as parameters. A reverse recovery time Trr(Sim) is obtained as a result of the simulation, the reference character (Sim) denoting that the value is obtained by simulation. To simplify the simulation, the lifetime values $\tau n$, $\tau p$ are assumed to be the same.

FIG. 34 is a schematic view showing a method for obtaining a lifetime value $\tau$ of a real TEG. As shown in this figure, where the vertical and horizontal axes indicate the reverse recovery time Trr(Sim) obtained by simulation and the lifetime value $\tau$, respectively, the simulation results are plotted to get a characteristic line L of a specific current density. Here, the reverse recovery time Trr is obtained by actual measurement in the same current density as when the characteristic line L was obtained. The point of the characteristic line L at the reverse recovery time Trr gives a lifetime value (indicated by two arrows in FIG. 34), which is the lifetime value $\tau$ in the wafer W shown in FIG. 29.

Similar measurement and simulation as described above with other current density can improve reliability of the lifetime value $\tau$ in the wafer W.

Since evaluation of the lifetime values is performed by forming the TEGs in the evaluative wafer that is independent of product wafer as illustrated above, the carrier lifetime value in a chip actually used for product is not evaluated. That is, evaluation of products is not directly but indirectly performed.

Further, the conventional method, as shown in FIG. 32, requires the function generator FG, the plus and minus power sources G1, G2, the pulse generation circuit PGC, the holder H, the resistor R, the probe pin PN and the oscilloscope Os, which complicates the method.

SUMMARY OF THE INVENTION

A first aspect of the present invention is directed to an evaluation pattern region for lifetime evaluation formed in a semiconductor substrate with first and second major surfaces, for evaluating carrier lifetime in the semiconductor substrate, the semiconductor substrate comprising: a first conductive layer of a first conductivity type with relatively low impurity concentration, the first conductive layer providing the first major surface; a second conductive layer of the first conductivity type with relatively high impurity concentration; and a third conductive layer of a second conductivity type different from the first conductivity type, the third conductive layer providing the second major surface, wherein an electrode region with relatively high impurity concentration is selectively formed in a surface portion of the first conductive layer, on a side of the first major surface.

A second aspect of the present invention is directed to an evaluation pattern region for lifetime evaluation formed in a semiconductor substrate with first and second major surfaces, for evaluating carrier lifetime in the semiconductor substrates, wherein a first conductive layer of a first conductivity type and a second conductive layer of a second conductivity type, different from the first conductivity type, provide the first and second major surfaces, respectively, the first conductive layer comprising: an electrode region with relatively high impurity concentration, the electrode region selectively formed in a surface portion on a side of the first major surface; and a connecting region with relatively low impurity concentration, for connecting the electrode region and the second conductive layer, wherein an area ratio between the electrode region at the first major surface and a portion functioning for the electrode region at the second major surface is determined so that the voltage values get isolated from each other in simulation of evaluating the carrier lifetime by obtaining voltage values at a reference current value for respective plurality of discrete values representing the carrier lifetime as a parameter.

Preferably, according to the fourth aspect of the present invention, the electrode region is formed at a scribe line in the semiconductor substrate.

Preferably, according to the fifth aspect of the present invention, the electrode region is formed in a chip allotted for evaluation in the semiconductor substrate.

Preferably, according to the sixth aspect of the present invention, the electrode region is formed in a chip allotted for product use in the semiconductor substrate.

In accordance with the structure of the first aspect of the present invention, the TEG for lifetime evaluation in a semiconductor substrate has made possible a direct evaluation of carrier lifetime in the semiconductor substrate to act actually as semiconductor devices with elements integrated. Compared with the structure with another semiconductor substrate produced for evaluation, the structure of the present invention can perform carrier lifetime evaluation in the semiconductor devices with higher accuracy, thereby improving reliability of the evaluation.

In accordance with the structure of the second aspect of the present invention, the location of the measured values of the TEG can be easily found by making comparison with the values obtained by simulation. This improves accuracy and thus reliability of the evaluation.

In accordance with the structure of the third aspect of the present invention, it is possible to evaluate lifetime with the electrode regions of different areas. In addition to the effect brought by the structure according to the second aspect of the present invention, this further improves reliability of the evaluation.

In accordance with the structure of the fourth and fifth aspects of the present invention, no electrode region is formed in the chip for product use to act actually as a semiconductor device in the semiconductor substrate. Thus, influence on the chip due to the formation of extra elements can be prevented.

In accordance with the structure of the fifth and sixth aspects of the present invention, evaluation of the chips for evaluation or for product use can be performed even after division of the semiconductor substrate. Not limited only before the division, evaluation is performable at an appropriate time. Especially according to the sixth aspect of the present invention, evaluation can be performed after the chip is used as a product, so that the structure of the present invention meets a requirement for evaluation in time sequence.

The present invention provides TEGs for lifetime evaluation achieving a direct evaluation of carrier lifetime in the wafer for product use. Further, TEGs for lifetime evaluation has such a structure as to improve accuracy in evaluation in relation to a method for simplifying lifetime evaluation.

These and other objects, features, aspects and advantages of the present invention will become more apparent from the following detailed description of the present invention when taken in conjunction with the accompanying drawings.

DESCRIPTION OF THE PREFERRED EMBODIMENTS

<First Preferred Embodiment>

This preferred embodiment is directed to TEGs for lifetime evaluation achieving a direct evaluation of carrier lifetime in a wafer for product use. The same reference symbols are used to designate components and structures identical to the conventional technique.

Figure 1:
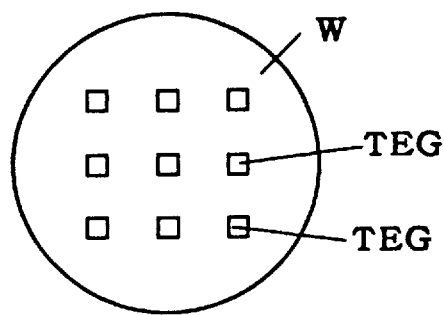
FIG. 1 is a plan view showing a structure of a wafer with TEGs in accordance with a first preferred embodiment.

FIG. 1 is a plan view showing a structure of a wafer W for product use with TEGs. The TEGs are in the shape of a square in the plane shown in FIG. 1. The wafer W includes IGBTs (insulated gate bipolar transistor) as integrated elements not shown.

Figure 2:
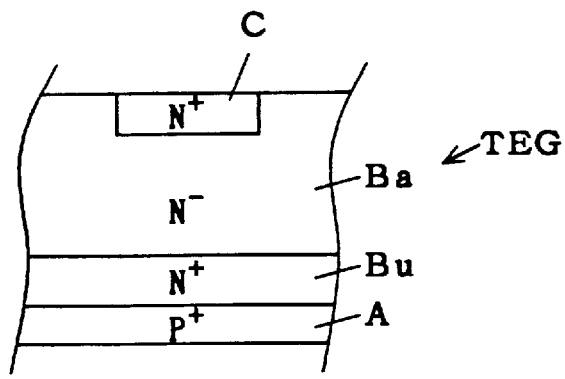
FIG. 2 is a sectional view showing a structure of a TEG in accordance with the first preferred embodiment.

FIG. 2 is a sectional view showing a structure of the TEG shown in FIG. 1. The TEG according to the present invention has a stacked structure, as shown in the present invention corresponds to a diode. Further, a cathode region C of $N^+$ is partially formed in the surface portion of the base region Ba.

Figure 3:
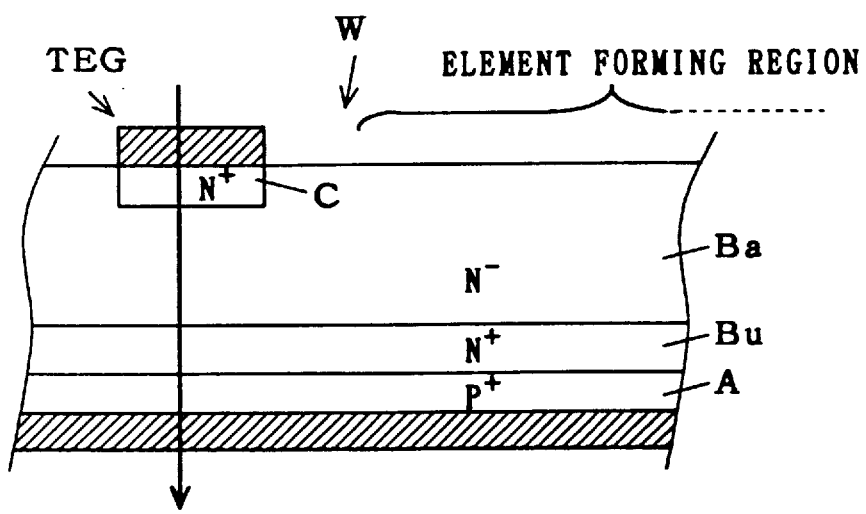
FIG. 3 is a sectional view showing a structure of a wafer with a TEG in accordance with the first preferred embodiment.

FIG. 3 is a sectional view showing a structure of the wafer W. The wafer W includes a region with IGBT elements and the TEG adjacent to the IGBT elements. A cathode electrode is formed on the cathode region C of the TEG. A collector electrode of the IGBT elements, formed at the bottom surface of the wafer W, serves as the anode electrode for the TEG. With reference to FIG. 3, the TEG structure shown in FIG. 2 is simultaneously formed when the IGBT elements are formed in the wafer W.

Figure 4:
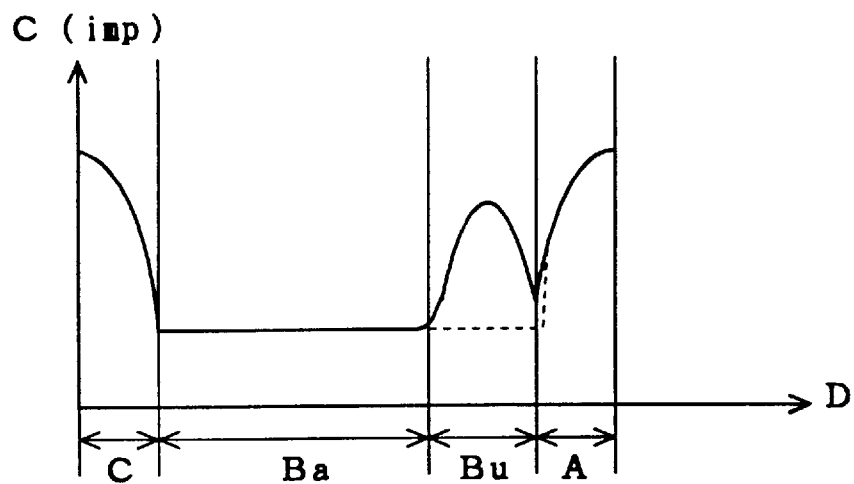
FIG. 4 is a graph showing a profile of impurity concentration of the TEG shown in FIG. 3.

FIG. 4 is a schematic view showing impurity concentration in the TEG to a depth in the sense of an arrow shown in FIG. 3. The vertical and horizontal axes denote impurity concentration C(imp) and a depth D, respectively. For profiles of the impurity concentration C(imp) of the TEG in this figure, a solid line corresponds to the case where the TEG includes the buffer region Bu as shown in FIG. 3, and a broken line, for reference, to the case where the TEG has no buffer region Bu.

As shown in FIG. 4, the profile of impurity concentration in the TEG with no buffer region Bu shows a symmetrical curve from the cathode region C to the anode region A, high at both ends of the cathode and anode regions C, A and low in an intermediate area between those ends. On the other hand, the profile of impurity concentration in the TEG shown in FIG. 3 shows an unsymmetrical curve due to existence of the buffer region Bu. Finishing the description of the TEG structure, we then present a method for evaluating carrier lifetime in the wafer W with the TEGs according to the present invention.

In the evaluation method according to the present invention, ON voltage with the TEGs according to the present invention.

Figure 5:
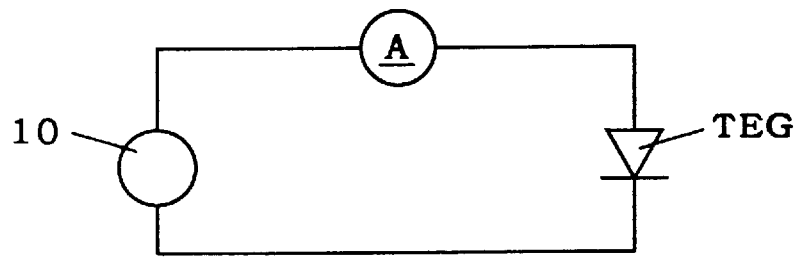
FIG. 5 is a circuit diagram representing a structure of a measuring system for TEG characteristics in accordance with the first preferred embodiment.
Figure 6:
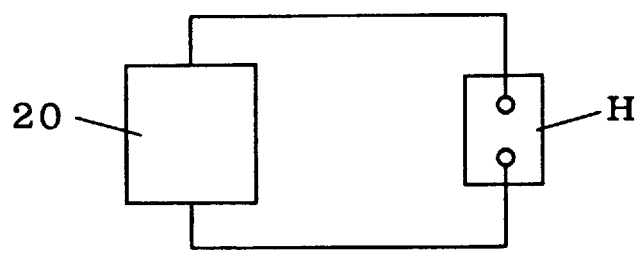
FIG. 6 is a circuit diagram representing devices for the structure shown in FIG. 5.

In the evaluation method according to the present invention, ON voltage values obtained by actual measurement of a real TEG and by simulation, respectively, are compared. First, devices required for the evaluation is described. FIG. 5 is a circuit diagram showing a measuring circuit with regard to the evaluation method according to the present invention. FIG. 6 is a schematic view showing devices for achieving the measuring circuit shown in FIG. 5.

In FIG. 5, a voltage source 10, an ammeter and the TEG with a diode structure are connected in series. A curve tracer 20 shown in FIG. 6 can provide a desired voltage and record the amount of current, functioning as the voltage source 10 and the ammeter shown in FIG. 5. A holder H holds a chip with the TEGs fixed thereto.

Figure 7:
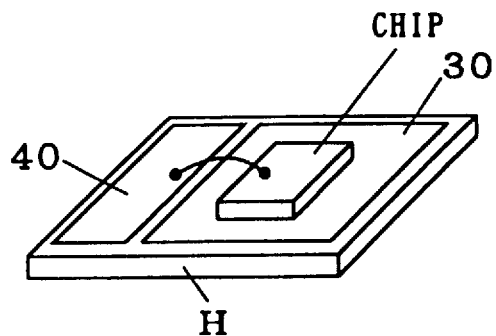
FIG. 7 is a perspective view showing a structure of the holder shown in FIG. 6.

FIG. 7 is a perspective view showing a detailed structure of the holder H with the chip fixed thereto. The holder H includes extraction electrodes 30, 40 to be connected to the anode and cathode electrodes of the TEG, respectively. The extraction electrode 30 is die-bonded to the anode electrode of the TEG and the extraction electrode 40 to the cathode electrode of the TEG via a wire.

Measurement of I-V characteristics with the curve tracer 20 shown in FIG. 6 is taken for the TEG fixed to the holder H.

Figure 32:
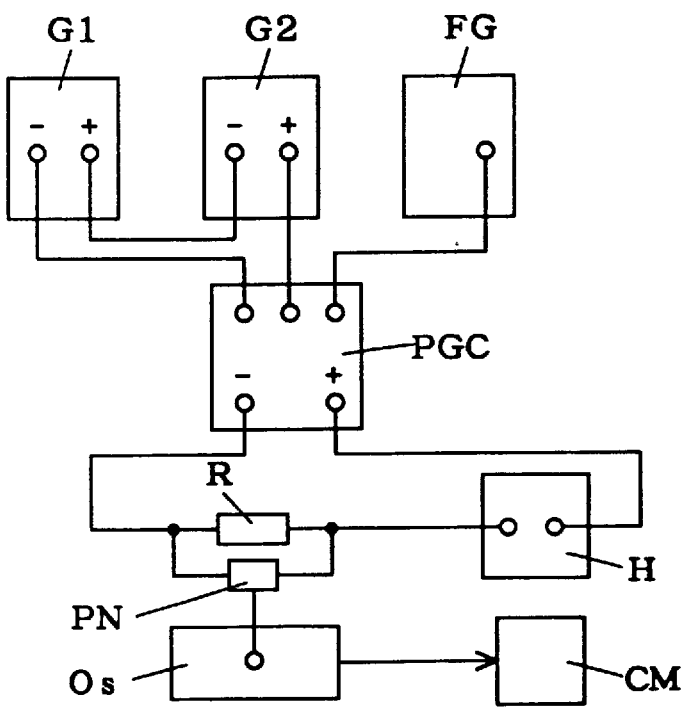
FIG. 32 is a schematic view showing devices for the circuit structure shown in FIG. 31.

On comparison of the structures of the devices shown in FIG. 6 and 32, respectively, it can be found that less device is required for the evaluation method according to the present invention, as shown in FIG. 6, than for the conventional evaluation method as shown in FIG. 32. This is because the conventional evaluation method handles characteristics changing in time sequence (dynamic characteristics), while the present evaluation method handles characteristics with no relation to change in time sequence (static characteristics) which will be described in detail later.

Figure 8:
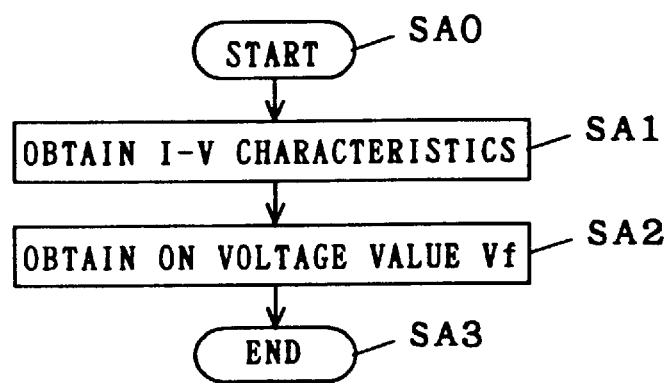
FIG. 8 is a flow chart illustrating a process for obtaining the TEG characteristics in accordance with the first preferred embodiment.

Next described is a process of the present evaluation method. FIG. 8 is a flow chart illustrating a process for obtaining the ON voltage values Vf by actual measurement with real TEGs.

Figure 9:
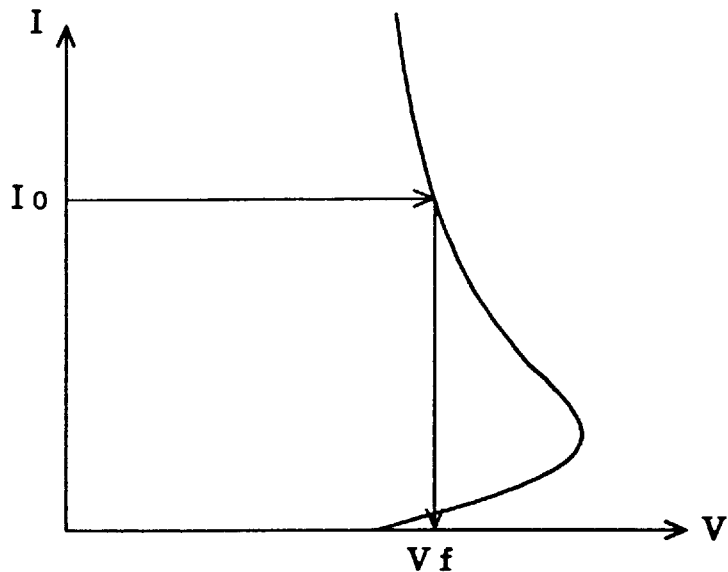
FIG. 9 is a graph showing a profile of I-V characteristics.

First, a control means for performing an automatic measurement starts a control (Step SA0). The control means takes a measurement of the TEG according to the present invention to obtain a profile of I-V characteristics as shown in FIG. 9 (Step SA1). More specifically, the control means obtains correlation between the voltage values applied to the cathode and anode electrodes of the TEG, and the value of the current flowing between those electrodes.

Then, as shown in FIG. 9, the control means obtains the ON voltage value Vf at a reference current value $I_0$ on the basis of the obtained profile (Step SA2). The reference current value $I_0$ may be arbitrarily set by an user in the control means. The control ends at a step SA3.

Figure 10:
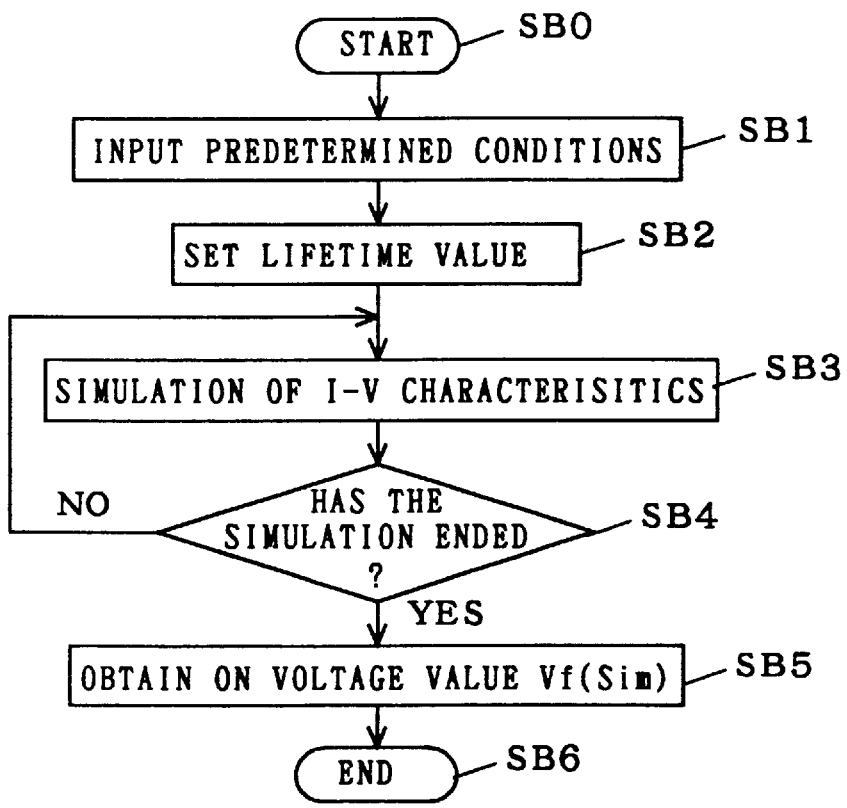
FIG. 10 is a flow chart illustrating a simulation process in accordance with the first preferred embodiment.

Next description presents a simulation process. FIG. 10 is a flow chart illustrating the simulation process. First, the process starts at a step SB0. An user inputs predetermined conditions for the TEG structure such as size, impurity concentration, into a device simulator at a step SB1. Then, at a step SB2, the user sets a plurality of carrier lifetime values as parameters in the simulation.

At a step SB3, the device simulator runs a simulation of I-V characteristics of the TEG. More specifically, an inside state of the TEG under the predetermined conditions is simulated for one of the carrier lifetime values set by the user. The simulation provides profiles of I-V characteristics, as shown in FIG. 9, which is unique to every applied lifetime value.

At a step SB4, an inquiry is made whether all simulations for all of the lifetime values set at the step SB2 are completed at the step SB3, namely whether the simulation has ended or not. When the answer is "YES", the process proceeds to a step SB5. When "NO", the process returns to the step SB3 to run a simulation for one of the remaining lifetime values.

At the step SB5, the ON voltage values Vf(Sim) at the reference current value $I_0$ are obtained with regard to a plurality of profiles of I-V characteristics obtained for respective lifetime values at the step SB3. Obtaining all of the ON voltage values Vf(Sim), the process ends at a step SB6.

Figure 11:
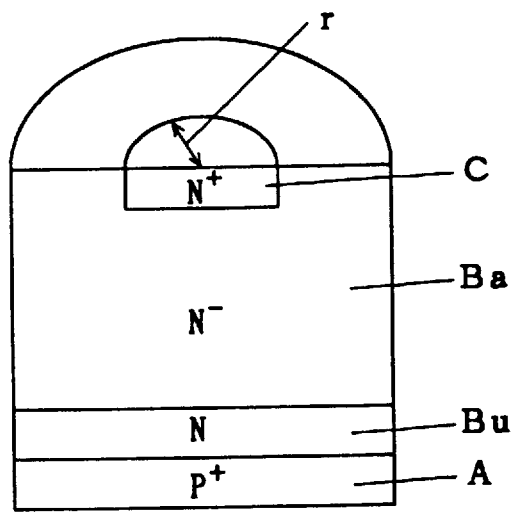
FIG. 11 is a perspective view showing a sectional structure of a model TEG for simulations.
Figure 12:
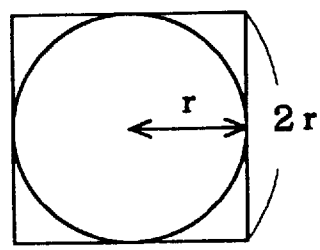
FIG. 12 is a plan view showing correlation between a real TEG and the model TEG shown in FIG. 11.

In simulation, the model TEG of cylindrical configuration as shown in FIG. 11 is used instead of the real TEG in the shape of a square. FIG. 12 is a plan view showing correlation between the real TEG and the model TEG. As shown in the figure, the outer rim of each component of the model TEG is determined by a circle inscribed in each corresponding component of the real TEG. The cathode region C of the model TEG, for example, has the outer rim tangent internally to that of the cathode region C of the real TEG. Thus, when the component of the real TEG is a square with each side 2r, the component of the model TEG is a circle with radius r.

The model TEG of cylindrical configuration is symmetrical on a section parallel to its bottom surface with respect to its center point. Thus, it becomes possible to reduce one of coordinates in simulation, resulting in quick simulation. Further, the lifetime values $\tau e$, $\tau p$ of electrons and holes, respectively, are assumed to be the same in simulation though the real values of those are different from each other. An error due to this assumption is so small as to be negligible.

Since the ON voltage values Vf(Sim) are obtained by obtaining profiles of I-V characteristics, some adjustment must be made for the difference in area of each component between the real and model TEGs as shown in FIG. 12. Thus, in simulation, the current value is multiplied by $4/\pi$ at the step SB5 illustrated in FIG. 10 to obtain the ON voltage values Vf(Sim). The value $4/\pi$ derives from an area ratio $4:\pi$ of a square to a circle inscribed in the square.

Figure 13:
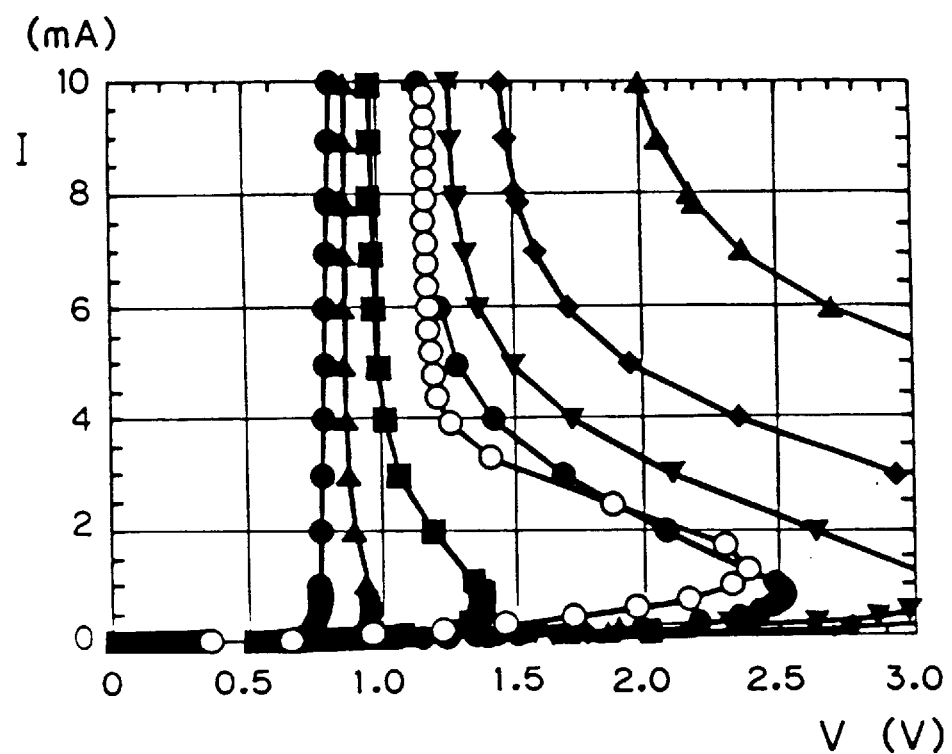
FIG. 13 is a graph illustrating respective results obtained by actual measurement and by simulation.

FIG. 13 is a graph illustrating profiles of I-V characteristics with regard to the measured values and the simulation results of TEGs. In the figure, the current value in simulation is plotted after multiplied by $4/\pi$. White circles denote the measured values of TEGs, and black marks such as circles and triangles denote the simulation results for respective lifetime values. Correlation between these marks and the lifetime values is shown in the figure. The real TEG in this figure has a cathode region in the shape of a square with each side 100 μm.

Suppose, for example, that the reference current value $I_0$ is 6 mA. With reference to FIG. 13, the intersections of profiles of I-V characteristics and the horizontal axis with the current value 6 mA represent the ON voltage values Vf and Vf(Sim). The figure at this point shows that the ON voltage values Vf indicated by white circles (i.e. measured values) are plotted between the ON voltage values Vf(Sim) with the lifetime value 20 μs indicated by black squares and those with the lifetime value 10 μs indicated by black circles, both obtained by simulation. Thus, the carrier lifetime value inside the real TEG can be considered within the range from 10 to 20 μs.

Further detailed comparison is also possible. Since both of the ON voltage values indicated by white and black circles are 1.2 V, close to each other, the carrier lifetime value inside the real TEG may be considered 10 μs.

For clarity of description, such inference of the lifetime values by comparison with the ON voltages is referred hereinafter to as an "inference action".

Reliability of the lifetime values obtained by the aforementioned method can be checked by comparison of those values with those obtained by the conventional method with the TEGs according to the present invention. The result of the comparison will be described later in a fifth preferred embodiment.

The TEGs for lifetime evaluation according to the present invention are formed in the semiconductor substrate for product use. This achieves a direct evaluation of carrier lifetime, leading to high reliability of lifetime evaluation.

Further, less device is required for the lifetime evaluation method described in this preferred embodiment, compared to the conventional method.

Though only the TEGs in the shape of a square are used in the aforementioned examples to clarify the simulation, any shape such as triangles is applicable to the TEGs according to the present invention.

<Second Preferred Embodiment>

The same components or structures as described above are denoted by the same symbols and reference characters, and will not be explained here.

Figure 14:
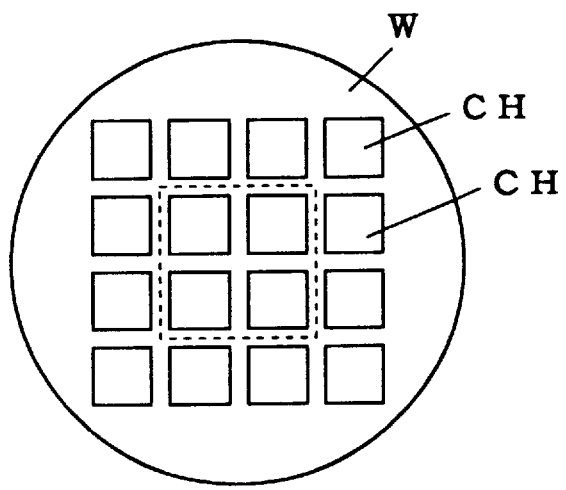
FIG. 14 is a plan view showing arrangement of chips in the wafer.
Figure 15:
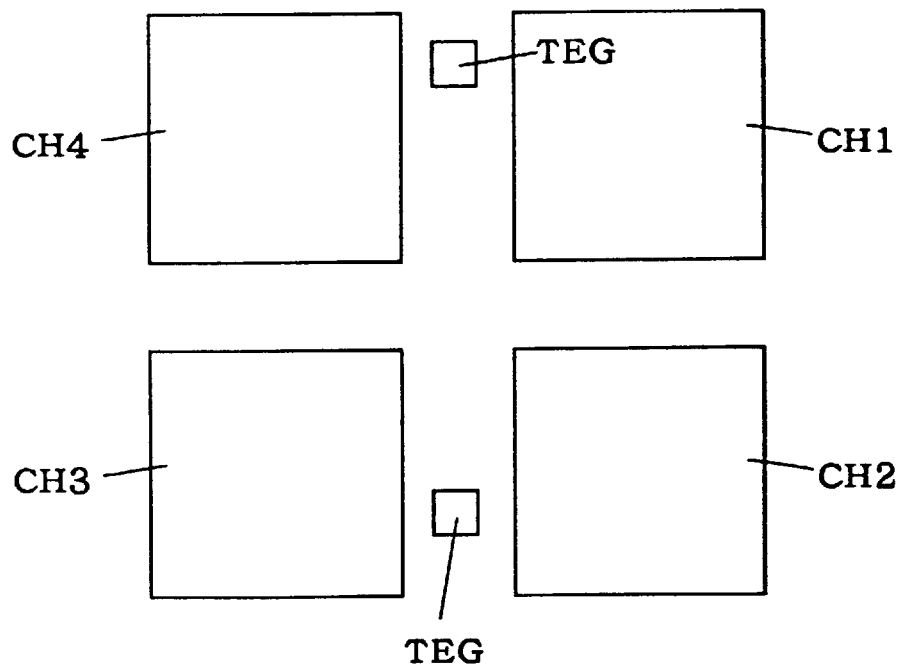
FIG. 15 is a plan view showing a structure with the TEGs formed at a scribe line in accordance with a second preferred embodiment.

FIG. 14 is a plan view showing the wafer W with chips CH. In this preferred embodiment, the TEGs according to the first preferred embodiment are formed at a scribe line between the chips CH. FIG. 15 is an enlarged plan view showing a part circled by a dotted line in FIG. 14. To clarify the description, the reference characters "CH1" to "CH4" are allotted to the chips from the upper right in a clockwise direction.

Strictly speaking, the carrier lifetime value varies depending on its position in the wafer. Thus, a plurality of TEGs are variously positioned so that inference of the lifetime values can be more accurate. With the TEG on the upper side in FIG. 15, the carrier lifetime values in the chips CH1 and CH4 can be inferred. Similarly, with the TEG on the lower side in FIG. 15, the carrier lifetime values in the chips CH2 and CH3 can be inferred.

When the wafer W shown in FIG. 14 is divided into the chips CH for product use, obviously no trace of the TEGs formed at the scribe line will remain in the chips CH. Thus, the integrated circuit would have no influence of the TEGs in the use of the chips CH. Further, there is no need to reserve an area for the TEGs in the chips CH which are to be products.

<Third Preferred Embodiment>

Figure 16:
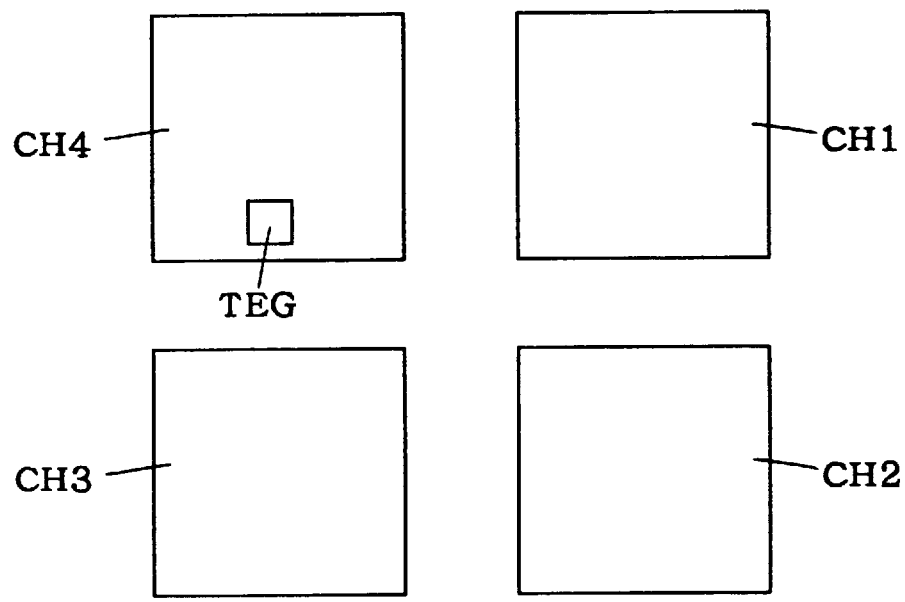
FIG. 16 is a plan view showing a structure with the TEG formed in the chip or test use in accordance with a third preferred embodiment.

While formed at the scribe line in the second preferred embodiment, the TEGs may be formed in a chip for test use. FIG. 16 is a plan view showing the wafer with the TEG formed in the chip for test use, as a substitute for the structure shown in FIG. 15.

A chip CH4 shown in FIG. 16 is used not for product but for test for the chips CH1 to CH3. Disposing the TEG in the chip CH4 for test use makes it possible to infer carrier lifetime in the chips CH1 to CH3. Further, as is the same case with the second preferred embodiment, no trace of the TEG will remain in the chips CH1 to CH3 which are to be products.

Furthermore, the TEG in the chip CH4 will remain after the chips CH1 to CH4 are divided out. Different from the case in the second preferred embodiment where the TEGs formed at the scribe line are lost, it is thus possible to evaluate lifetime even after the chips are made of product.

<Fourth Preferred Embodiment>

Figure 17:
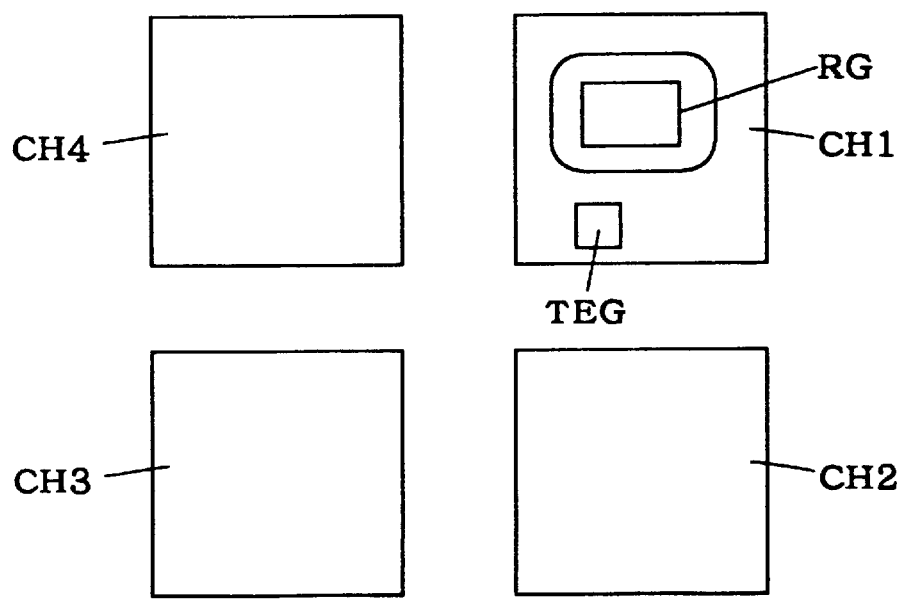
FIG. 17 is a plan view showing a structure with the TEG formed in the chip or product use in accordance with a fourth preferred embodiment.

In this preferred embodiment, the TEGs are formed in the chip for product use. FIG. 17 is a plan view showing the structure with the TEG formed in a chip CH1 for product use. The TEG is formed in an area except a region RG serving as an element.

In addition to a direct evaluation of the carrier lifetime values in the chip CH1 for product use, another advantage in this preferred embodiment is that evaluation can be performed at any time regardless of before and after division of the wafer. The TEG may be formed in the chips CH2 to CH4 as well.

The respective methods for disposing the TEGs according to the second to fourth preferred embodiments are not exclusive to each other. It is, for example, possible to dispose the TEGs both in the chip CH4 for test use and at the scribe line.

<Fifth Preferred Embodiment>

Figure 18:
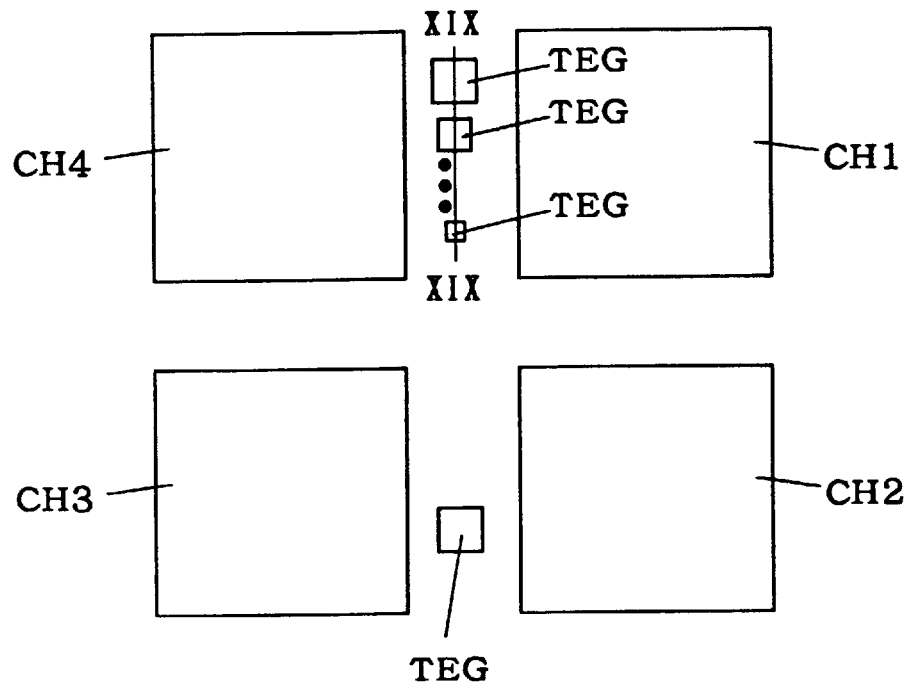
FIG. 18 is a plan view showing a structure with a plurality of TEGs formed at the scribe line in accordance with a fifth preferred embodiment.
Figure 19:
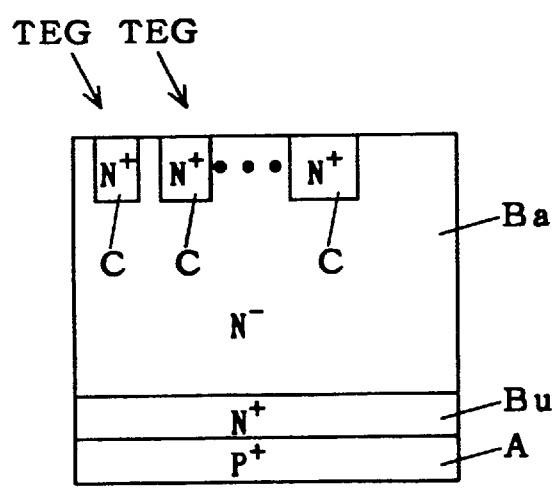
FIG. 19 is a sectional vie showing a structure taken along a line XIX—XIX shown in FIG. 18.

FIG. 18 is a plan view showing a structure with a plurality of TEGs of different areas formed at the scribe line. FIG. 19 is a sectional view showing a section taken along a line XIX—XIX shown in FIG. 18. As shown in FIG. 19, a plurality of cathode regions C are formed so as to provide the plurality of TEGs.

Evaluation with the plurality of TEGs of different areas makes the areas of the cathode regions C in the TEGs another variation in comparison of the inference action according to the first preferred embodiment.

Figure 20:
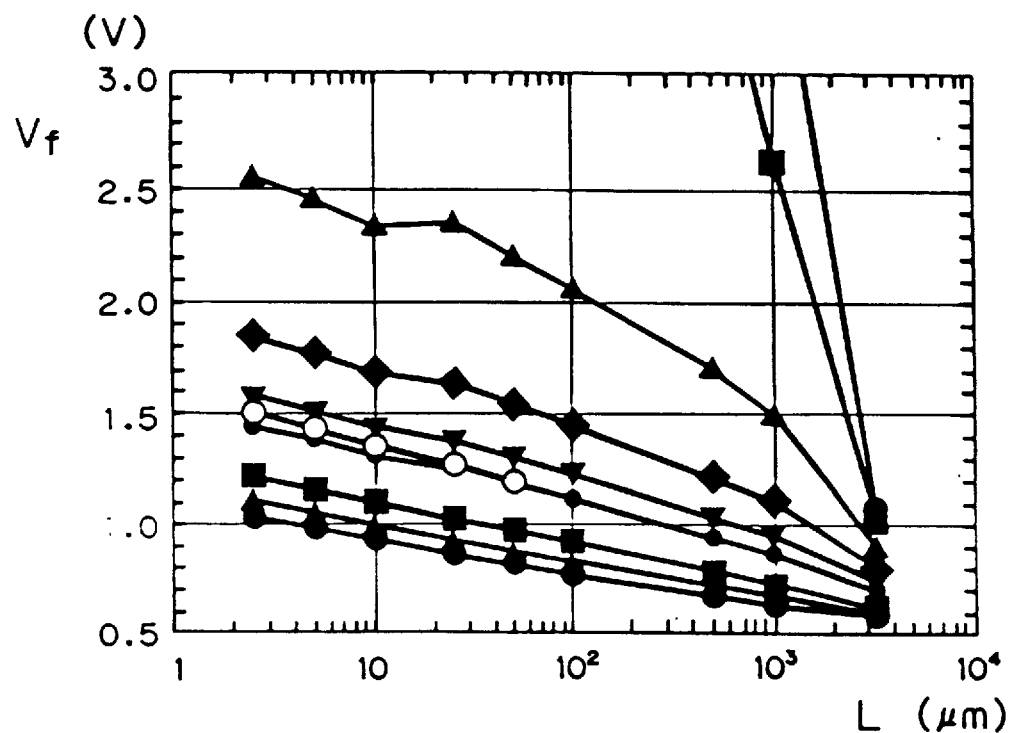
FIG. 20 is a graph illustrating analysis related to TEGs in accordance with the fifth preferred embodiment.

FIG. 20 is a graph with the vertical axis indicating the ON voltage value Vf and the horizontal axis indicating a length L with regard to the cathode regions C. The length L with regard to the cathode regions C corresponds to a half length of one side of a square in the real TEG, or radius of a circle in the model TEG. Since an area is proportional to a square of length, this figures shows correlation among the lifetime values, the areas of the cathode regions C and the ON voltage values Vf.

In the first preferred embodiment, there is no variation of area of the TEGs in the inference action. This preferred embodiment, on the other hand, provides variation of areas, so that data is illustrated by not dots but lines as shown in FIG. 20. This improves reliability of the inference action compared with the first preferred embodiment.

In the graph shown in FIG. 20, the carrier lifetime value in the real TEG indicated by white circles is very close to the simulation result with the carrier lifetime value 10 $\mu$s indicated by black circles. Thus, the carrier lifetime value in the real TEG can be inferred about 10 $\mu$s.

An analyst's workload can be reduced by applying a display means for inputting respective data of the real and the model TEGs obtained through the processes illustrated in FIGS. 8 and 10 (lifetime value $\tau$, length L and ON voltage Vf as parameters), respectively, and for automatically plotting those data to be displayed as shown in FIG. 20.

As described in the first preferred embodiment, reliability of the lifetime value obtained by the aforementioned method can be checked by comparing it with the lifetime value obtained by the conventional method with the use of the TEGs of the present invention to the conventional method.

Figure 21:
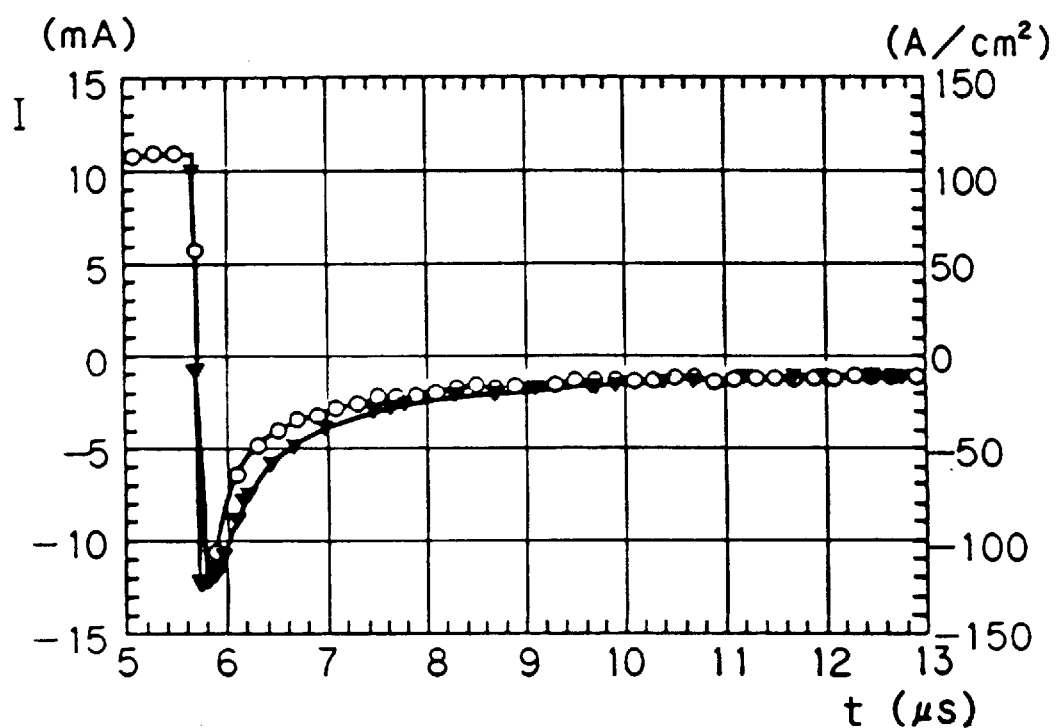
FIG. 21 is a graph illustrating results obtained by the conventional method through test of the TEGs according to the present invention.
Figure 22:
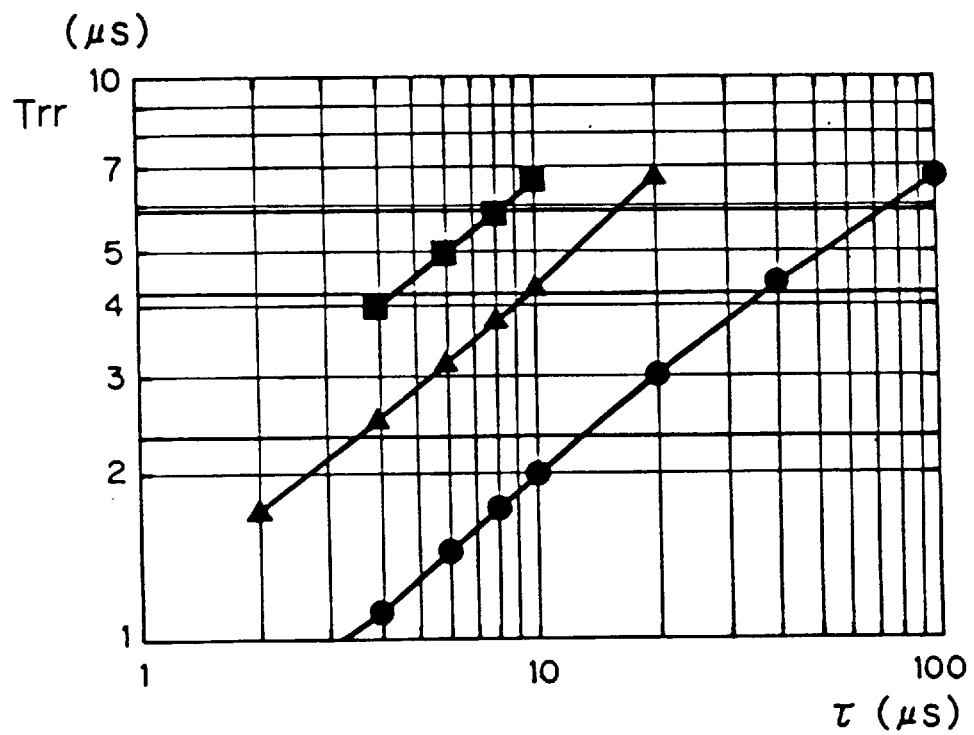
FIG. 22 is a graph illustrating analysis on the results illustrated in FIG. 21.
Figure 33:
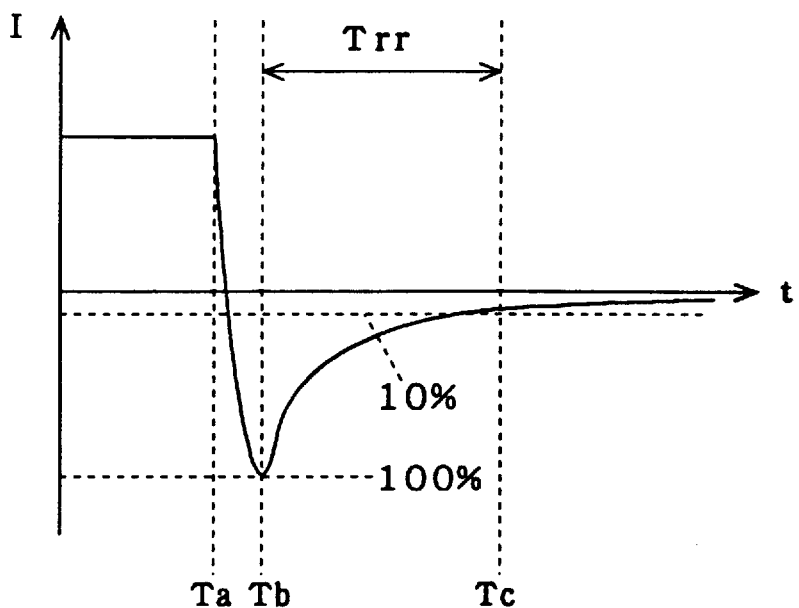
FIG. 33 shows a waveform for explaining the reverse recovery time Trr.
Figure 34:
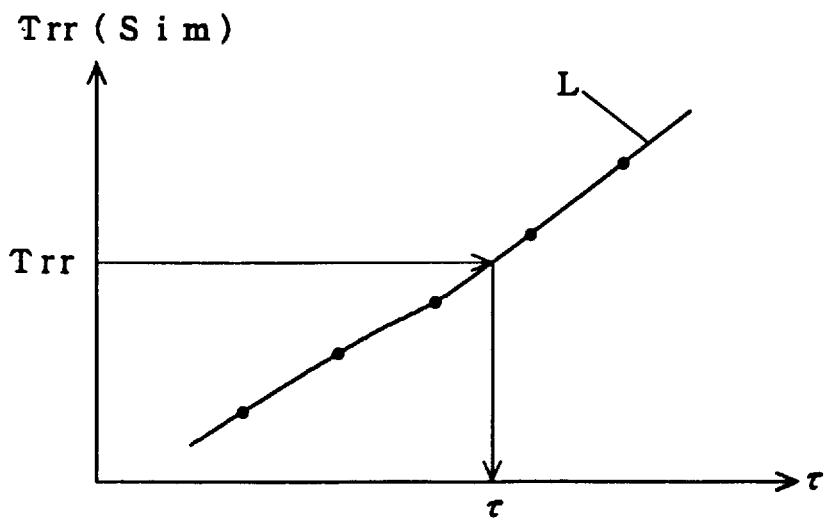
FIG. 34 is a schematic view showing the conventional method of lifetime evaluation.

FIGS. 21 and 22 showing graphs correspond to FIGS. 33 and 34, respectively. In FIG. 21, the vertical axes on the left side and on the right side indicate current value I in the TEG and current density, respectively, and the horizontal axis indicates time t with regard to the application of the pulse voltage. In this graph, white circles denote values of the real TEG where each side of a square of the emitter region E is 100 $\mu$m, and black triangles denote simulation results where the lifetime value $\tau$ is 8 $\mu$s, to obtain correlation shown in FIG. 22.

FIG. 22 is a graph obtained by drawing lines between simulation results for every current value at each predetermined value of the load resistance. The vertical and horizontal axes indicate the reverse recovery time Trr and the lifetime value $\tau$, respectively. The reverse recovery time Trr of the real TEG can be read as 5.85 $\mu$s from FIG. 21. In FIG. 22, black squares correspond to the case where the current value at the predetermined value of the pulse voltage is ±10 mA. The lifetime value at the intersection of the line drawn between the black squares and the reverse recovery time 5.85 $\mu$s is about 8 $\mu$s.

Therefore, the lifetime values obtained by the present method and the conventional method are 10 $\mu$s and 8 $\mu$s, respectively. Considering that only rough lifetime values can be obtained by the conventional method, it can be said that the lifetime values are inferable by the present method.

FIG. 22 further shows cases where the current values at the predetermined value of the load resistance are ±20 and ±100 mA, respectively. The reverse recovery times Trr for the current values ±20 and ±100 mA are 4.17 and 2.29 $\mu$s, respectively.

Figure 23:
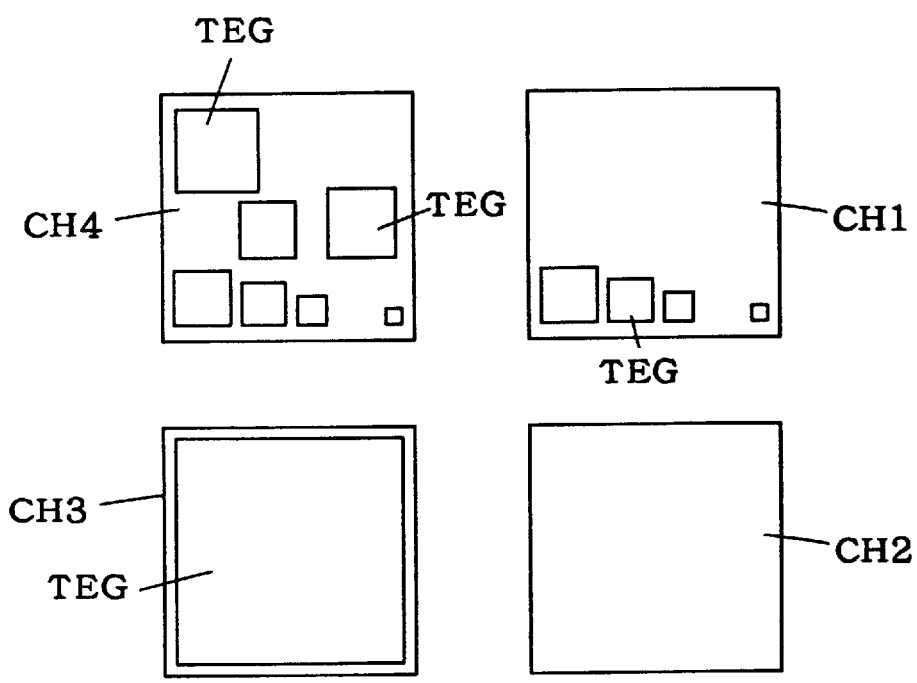
FIG. 23 is a plan view showing a structure with a plurality of TEGs formed in both of the respective chips for test and for product use in accordance with the fifth preferred embodiment.

Though formed at the scribe line in the above description, the plurality of TEGs is formed not only at the scribe line. FIG. 23 is a plan view showing a structure with a plurality of TEGs, chips CH1 and CH2 for product use and chips CH3 and CH4 for evaluation of the chips CH1 and CH2.

In the chip CH1, a plurality of TEGs of different areas are formed. The chip 4 has a plurality of TEGs scattered around. The chip CH3 is covered all over with one TEG to increase variation of the area of the cathode regions C.

Figure 24:
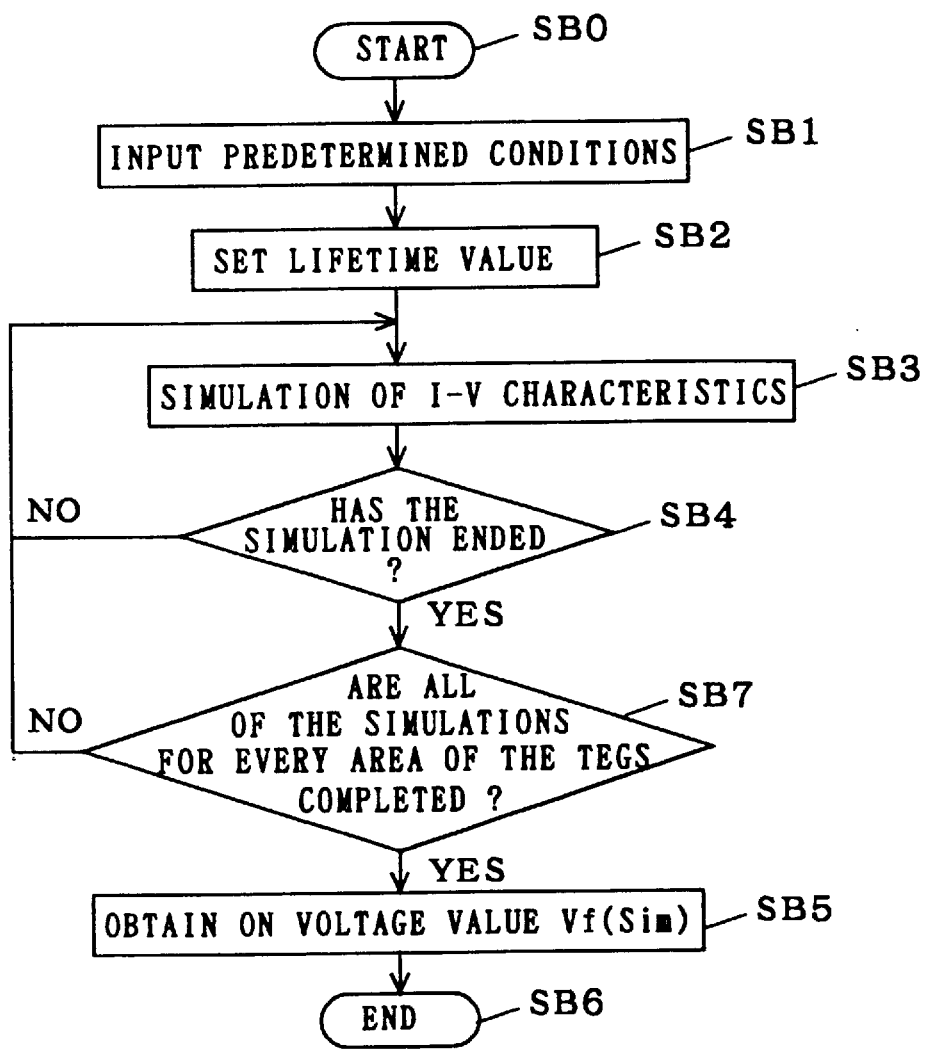
FIG. 24 is a flow chart illustrating a process for obtaining characteristics of the plurality of TEGs in accordance with the fifth preferred embodiment.

In this preferred embodiment, a step SB7 must be added to the process shown in FIG. 10 due to the formation of the plurality of TEGs. FIG. 24 is a flow chart illustrating a simulation process including the step SB7. The step SB7 is added between the steps SB4 and SB5 shown in FIG. 10 to check whether simulation is performed for all areas of the TEGs.

When the answer at the step SB7 is "YES", the process proceeds to the step SB5 for the next. When the answer is "NO", the process returns to the step SB3 to do a simulation for the remaining areas of the TEGs. As to the process shown in FIG. 8, every area requires the steps SAO to SA3 to be taken.

The formation of the plurality of TEGs with the cathode regions C of different areas, described in this preferred embodiment, improves reliability of the carrier lifetime evaluation.

<Sixth Preferred Embodiment>

With reference to FIG. 20, the ON voltage values Vf in simulation for every lifetime value get isolated from each other as the area (length L) of the cathode region C is smaller. On the other hand, when the area of the cathode region C is large, for example the length L of about $3 \times 10^3$ $\mu$m, every simulation result is close to each other.

When the simulation results are close to each other and the measured value of the real TEG is placed between those simulation results, it is difficult to find out which result is close to the measured value. It is, however, easy when the simulation results get isolated from each other. Thus, it is desirable to set the areas of the cathode regions C small so that the simulation results get isolated from each other. Here, "the areas of the cathode regions C is small" means that the cathode regions C are small compared to the anode region A. Described afterward is how to set sizes of the cathode regions C to reduce an area ratio of the cathode regions C to that of the anode region A. To describe the area ratio, an area to be a standard must be clarified. Thus, the area of components in the wafer is first discussed.

Figure 25:
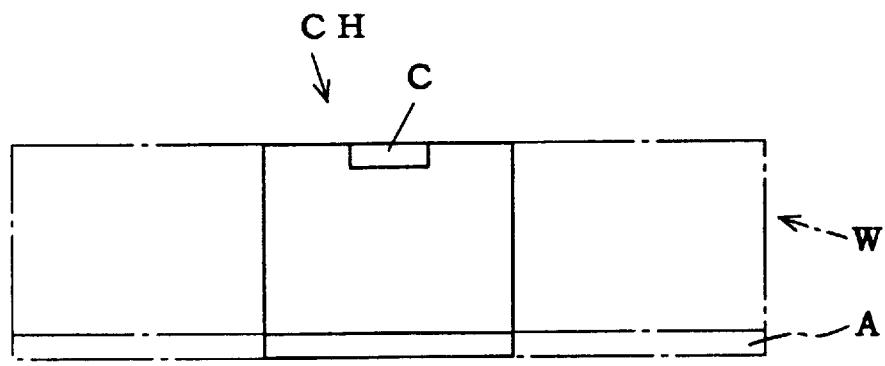
FIG. 25 is a sectional view for explaining the structure in accordance with a sixth preferred embodiment.

FIG. 25 is a sectional view showing the wafer W with a chained line and the chip CH divided from the wafer W with a solid line. As it is obvious from the figure, when the wafer W is divided to form the chip CH, the area of the anode region A forming a pair with the cathode region C changes from before to after the division. Thus, it is important to clearly define respective areas of the cathode and anode regions C, A, forming a pair with each other.

Figure 26:
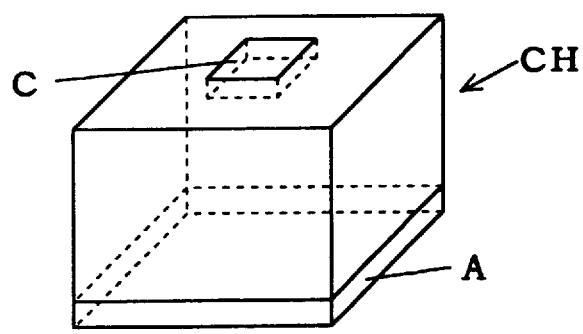
FIG. 26 is a perspective view for explaining the structure in accordance with the sixth preferred embodiment.

As shown in FIG. 26, both of the cathode and anode regions C, A in the chip CH have six surfaces including top and bottom surfaces and side surfaces. The area of the cathode region C is regarded as the area exposed as a top surface of the chip CH in its six surfaces. Similarly, the area of the anode region A is regarded as the area exposed as a bottom surface of the chip CH in its six surfaces.

Figure 27:
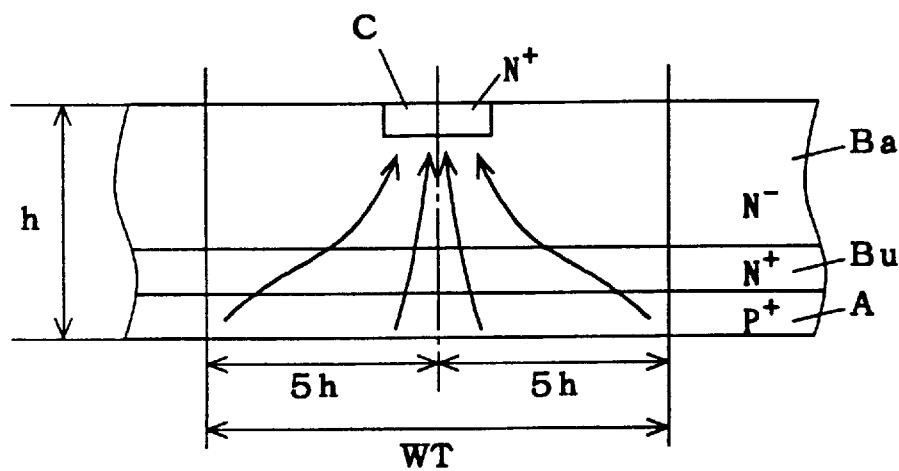
FIG. 27 is a sectional view for explaining the structure in accordance with the sixth preferred embodiment.

FIG. 27 is a sectional view showing to what extent the anode region A corresponds to one cathode region C. The intersection of the center line, passing through a center of the cathode region C, and the anode region A indicates that an area 5h, five times as long as a height h of the wafer W (chip CH), in the anode region A (width 10h when including right and left sides), makes a pair with the cathode region C. The area within this range actually serves as an anode region for the cathode region C, and the current will flow from the anode region A to the cathode region C as shown by arrows in the figure.

Figure 28:
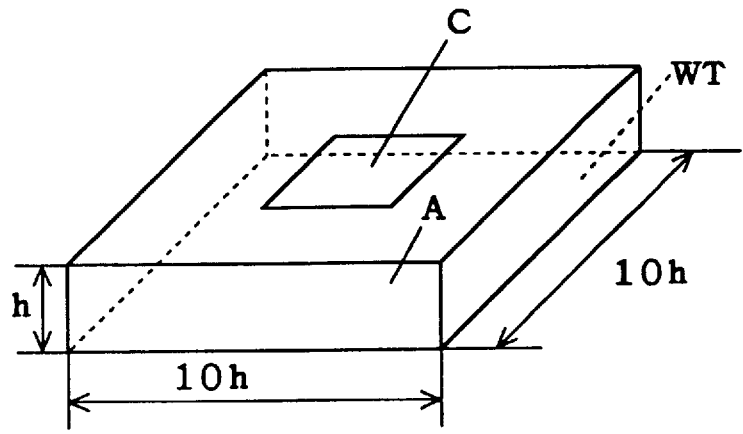
FIG. 28 is a perspective view for explaining the structure in accordance with the sixth preferred embodiment.
Figure 29:
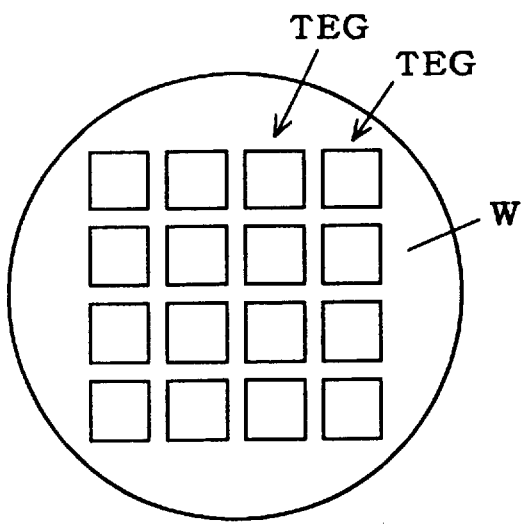
FIG. 29 is a plan view showing arrangement of conventional TEGs for lifetime evaluation.
Figure 30:
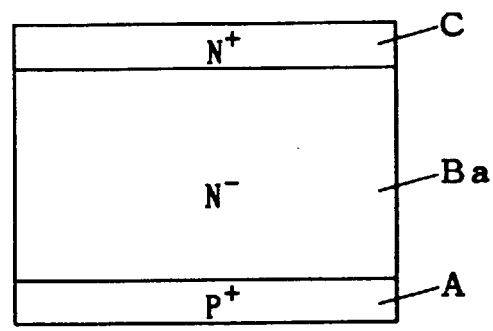
FIG. 30 is a sectional view showing a structure of a conventional TEG for lifetime evaluation.
Figure 31:
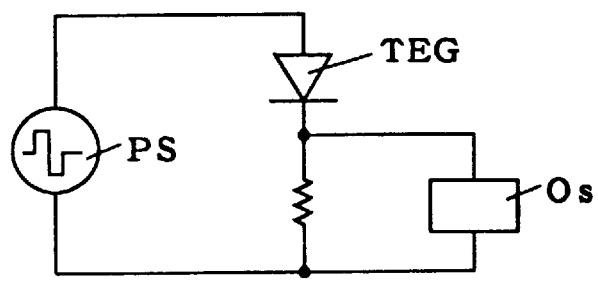
FIG. 31 is a circuit diagram representing a circuit structure for the conventional evaluation method applied to the TEG for lifetime evaluation.

The area actually functioning in the anode region A is referred hereinafter to as a function region WT. Further, the ratio of areas between the emitter region E and the function region WT is referred to as an area ratio Ra (an area of the cathode region C to that of the function region WT). FIG. 28 is a perspective view showing the cathode region C and the function region WT.

Next description is about how to set the area of the cathode region C small so that simulation results deviate from each other as described above. With reference to FIG. 20, the rightmost data with the length L of about $3 \times 10^3 \, \mu m$, is obtained when the area ratio Ra is 1. As it is obvious from the figure, enough interval is maintained between each data within the range of the length L below $10^2 \, \mu m$. Since an area is proportional to a square of length, it is enough to form the emitter region E so as to set the area ratio Ra in the range of about 1/1750000 to 1/4500.

Reduction in the area ratio makes it easy to observe correlation between the results by actual measurement and by simulation. It further improves accuracy of evaluation, resulting in improvement in reliability.

While the invention has been described in detail, the foregoing description is in all aspects illustrative and not restrictive. It is understood that numerous other modifications and variations can be devised without departing from the scope of the invention.

I claim:

1. An evaluation pattern region for lifetime evaluation formed in a semiconductor substrate with first and second major surfaces, for evaluating carrier lifetime in said semiconductor substrate, said semiconductor substrate comprising:
a first conductive layer of a first conductivity type with relatively low impurity concentration, said first conductive layer providing said first major surface;
a second conductive layer of said first conductivity type with relatively high impurity concentration; and
a third conductive layer of a second conductivity type different from said first conductivity type, said third conductive layer providing said second major surface,
wherein an electrode region with relatively high impurity concentration is selectively formed in a surface portion of said first conductive layer, on a side of said first major surface.

2. The evaluation pattern region for lifetime evaluation according to claim 1,
wherein said electrode region is formed at a scribe line in said semiconductor substrate.

3. The evaluation pattern region for lifetime evaluation according to claim 1,
wherein said electrode region is formed in a chip allotted for evaluation in said semiconductor substrate.

4. The evaluation pattern region for lifetime evaluation according to claim 1,
wherein said electrode region is formed in a chip allotted for product use in said semiconductor substrate.

5. An evaluation pattern region for lifetime evaluation formed in a semiconductor substrate with first and second major surfaces, for evaluating carrier lifetime in said semiconductor substrate,
wherein a first conductive layer of a first conductivity type and a second conductive layer of a second conductivity type, different from said first conductivity type, provide said first and second major surfaces, respectively,
said first conductive layer comprising:
an electrode region with relatively high impurity concentration, said electrode region selectively formed in a surface portion on a side of said first major surface; and
a connecting region with relatively low impurity concentration, for connecting said electrode region and said second conductive layer,
wherein an area ratio between said electrode region at said first major surface and a portion functioning for said electrode region at said second major surface is determined so that said voltage values get isolated from each other in simulation of evaluating said carrier lifetime by obtaining voltage values at a reference current value for respective plurality of discrete values representing said carrier lifetime as a parameter.

6. The evaluation pattern region for lifetime evaluation according to claim 5,
wherein said electrode region includes a plurality of electrode regions of different areas.

7. The evaluation pattern region for lifetime evaluation according to claim 6,
wherein said plurality of electrode regions are formed at a scribe line in said semiconductor substrate.

8. The evaluation pattern region for lifetime evaluation according to claim 6,
wherein said plurality of electrode regions are formed in a chip allotted for evaluation in said semiconductor substrate.

9. The evaluation pattern region for lifetime evaluation according to claim 6,
wherein said plurality of electrode regions are formed in a chip allotted for product use in said semiconductor substrate.

* * * * *